United States Patent
Nakazumi et al.

(10) Patent No.: US 10,438,814 B2
(45) Date of Patent: Oct. 8, 2019

(54) METHOD FOR MANUFACTURING WIRING PATTERN, METHOD FOR MANUFACTURING TRANSISTOR, AND MEMBER FOR TRANSFER

(71) Applicant: NIKON CORPORATION, Tokyo (JP)

(72) Inventors: Makoto Nakazumi, Yamato (JP); Yasutaka Nishi, Tokyo (JP); Kei Nara, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/843,539

(22) Filed: Dec. 15, 2017

(65) Prior Publication Data

US 2018/0108539 A1    Apr. 19, 2018

Related U.S. Application Data

(63) Continuation of application No. PCT/JP2016/067870, filed on Jun. 16, 2016.

(30) Foreign Application Priority Data

Jun. 17, 2015  (JP) .................................. 2015-121905

(51) Int. Cl.
    *H01L 21/00*  (2006.01)
    *H01L 21/447*  (2006.01)
    (Continued)

(52) U.S. Cl.
    CPC ...... *H01L 21/447* (2013.01); *H01L 21/02565* (2013.01); *H01L 21/02631* (2013.01);
    (Continued)

(58) Field of Classification Search
    CPC . H01L 21/447; H01L 21/02; H01L 29/66969; H01L 29/4908; H01L 21/47635;
    (Continued)

(56) References Cited

U.S. PATENT DOCUMENTS 3,801,388 A * 4/1974 Akiyama ............. H05K 3/4685
                                                        174/261
7,036,209 B1 * 5/2006 Wago .................... B82Y 10/00
                                                        29/602.1

(Continued)

FOREIGN PATENT DOCUMENTS

JP    5-47701    2/1993
JP    6-82825    3/1994

(Continued)

OTHER PUBLICATIONS

International Search Report dated Sep. 6, 2016 in corresponding International Patent Application No. PCT/JP2016/067870.

*Primary Examiner* — Vu A Vu

(57) ABSTRACT

An object is to provide a novel method in place of the above-described conventional technology, as a technique for obtaining a thin film with a wiring pattern applied. A method for manufacturing a wiring pattern according to the present invention is characterized in that the method includes: a laminate forming step of forming a laminate by bringing a first member that has a resist layer and a metal layer formed on the resist layer into contact with a second member that includes a substrate; a resist layer patterning step of subjecting the resist layer to patterning; and an etching step of selectively removing the metal layer.

13 Claims, 16 Drawing Sheets

(51) Int. Cl.
*H01L 29/417* (2006.01)
*H01L 29/786* (2006.01)
*H01L 21/02* (2006.01)
*H01L 21/4763* (2006.01)
*H01L 29/49* (2006.01)
*H01L 29/66* (2006.01)
*H01L 31/00* (2006.01)
*H01L 21/445* (2006.01)

(52) U.S. Cl.
CPC ...... *H01L 21/47635* (2013.01); *H01L 29/417* (2013.01); *H01L 29/4908* (2013.01); *H01L 29/66969* (2013.01); *H01L 29/786* (2013.01); *H01L 29/7869* (2013.01); *H01L 31/00* (2013.01); *H01L 21/445* (2013.01)

(58) Field of Classification Search
CPC ........... H01L 29/7869; H01L 21/02631; H01L 21/02565; H01L 29/786; H01L 29/417; H01L 21/28
USPC .......................................................... 438/104
See application file for complete search history.

(56) References Cited

U.S. PATENT DOCUMENTS

| | | | | |
|---|---|---|---|---|
| 7,915,106 | B2* | 3/2011 | Shim | H01L 21/28587 |
| | | | | 257/E21.205 |
| 7,969,005 | B2* | 6/2011 | Nakasato | H01L 24/11 |
| | | | | 257/737 |
| 8,603,349 | B2* | 12/2013 | Lee | B29C 33/3842 |
| | | | | 216/22 |
| 2004/0166446 | A1* | 8/2004 | Kawaguchi | G11B 7/261 |
| | | | | 430/320 |
| 2004/0178527 | A1* | 9/2004 | Liao | G02F 1/1341 |
| | | | | 264/1.34 |
| 2004/0224445 | A1* | 11/2004 | Schmidt | H01L 21/82380 |
| | | | | 438/145 |

FOREIGN PATENT DOCUMENTS

| | | |
|---|---|---|
| JP | 2006-73794 | 3/2006 |
| JP | 2007-115805 | 5/2007 |
| JP | 2009-130327 | 6/2009 |
| JP | 5445590 | 1/2014 |

* cited by examiner

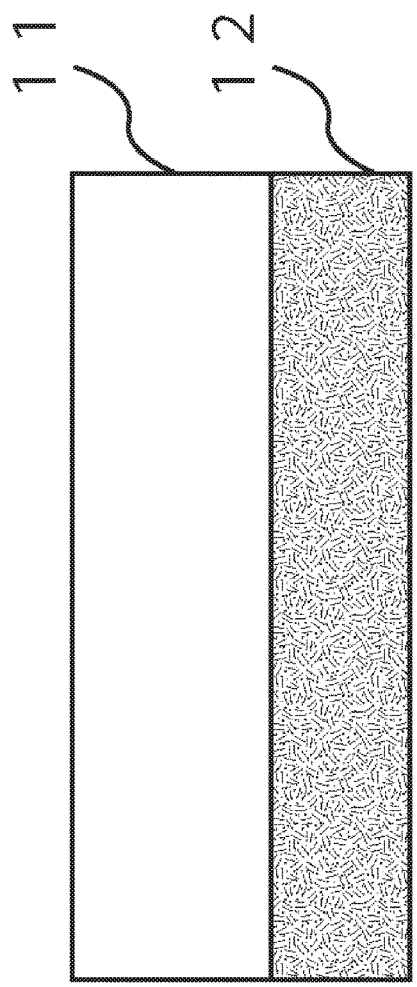

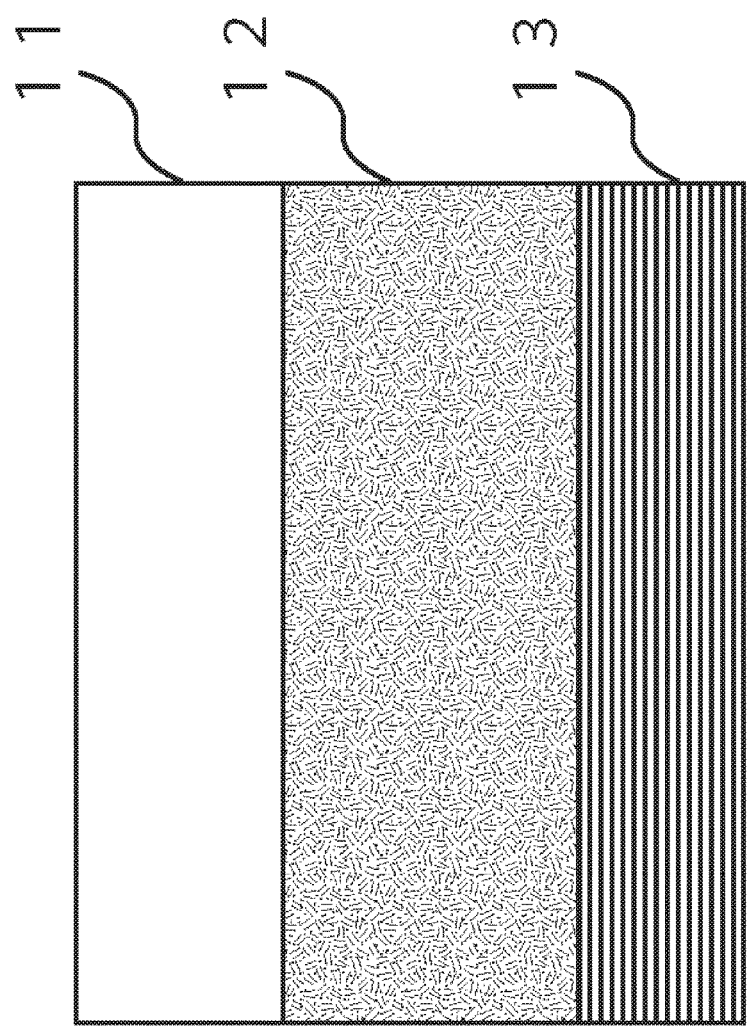

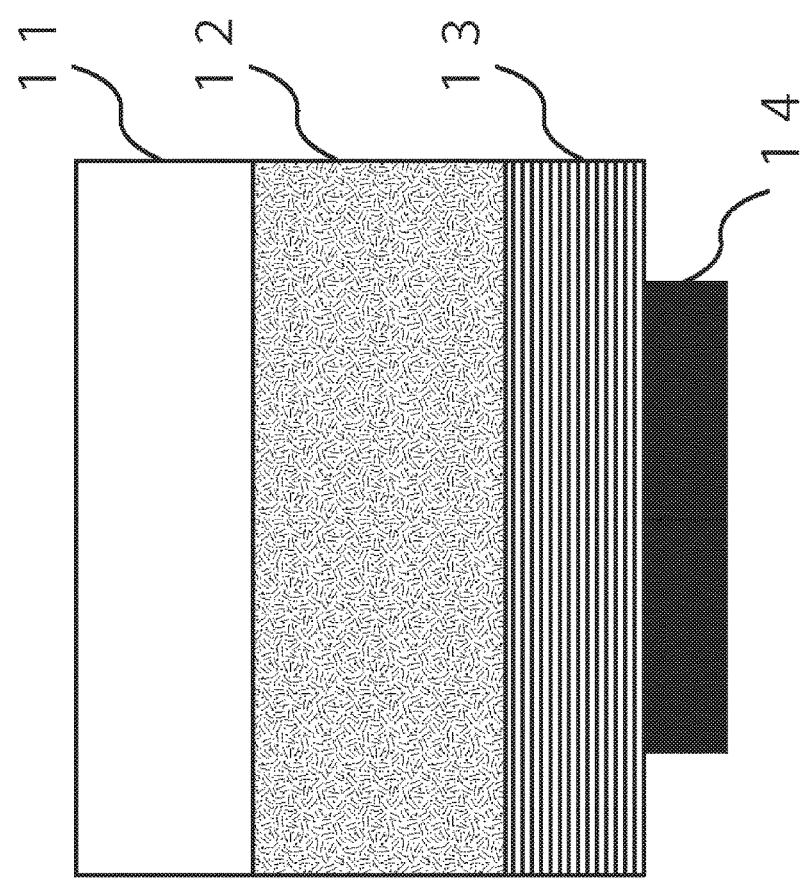

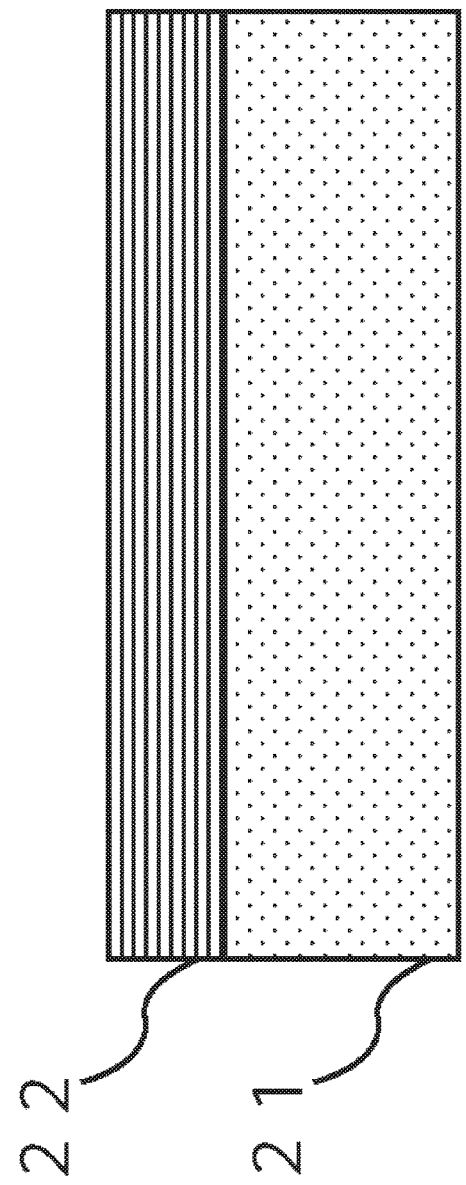

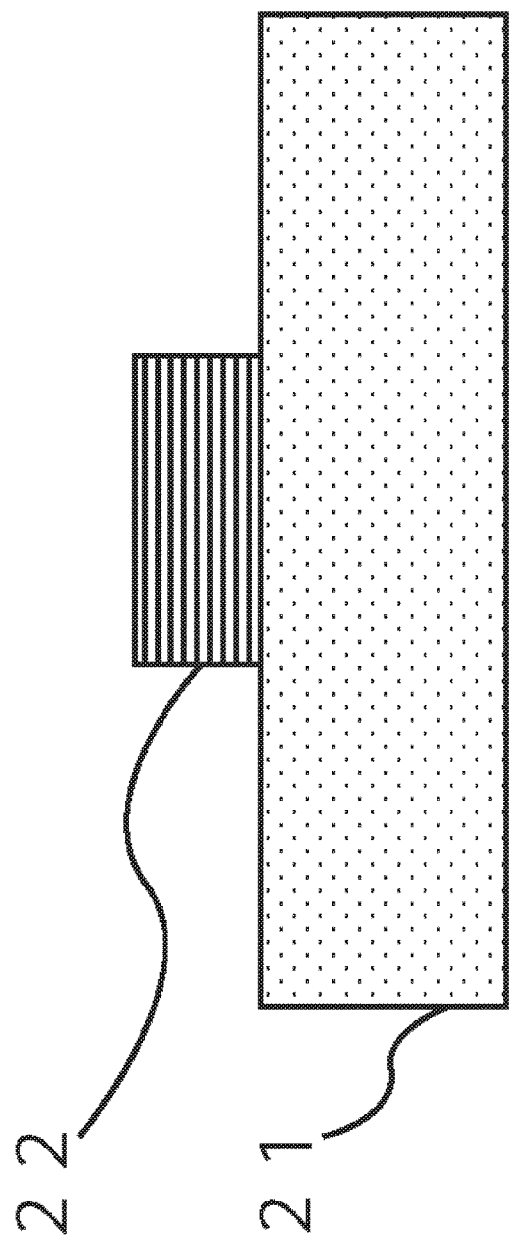

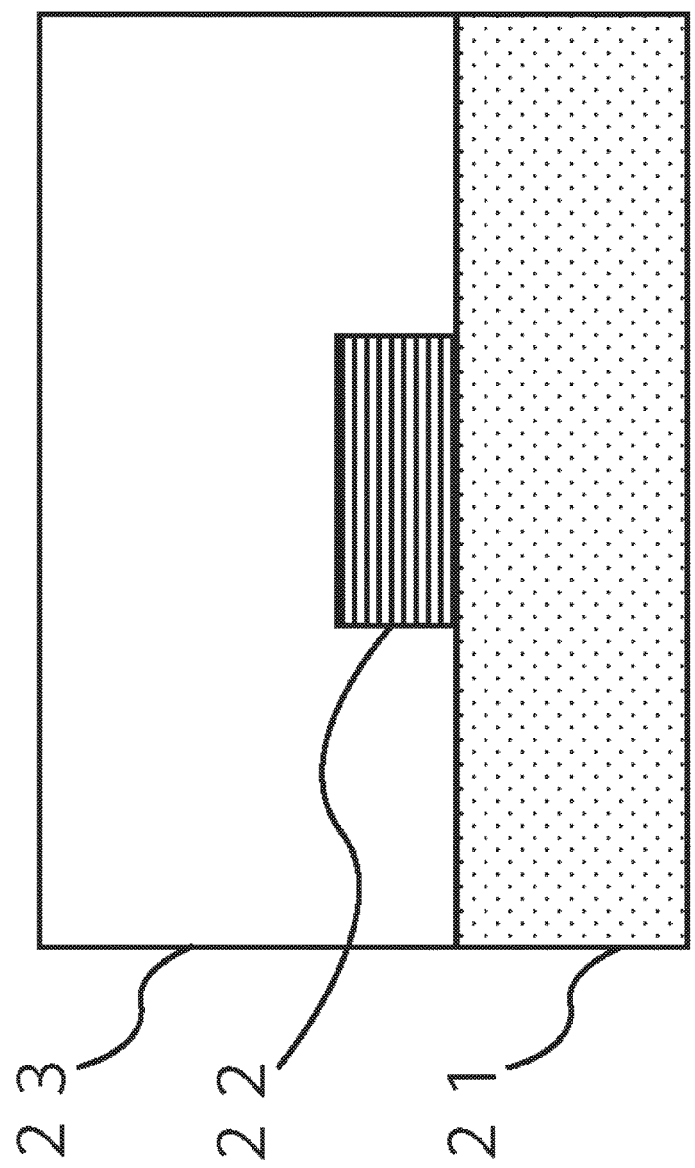

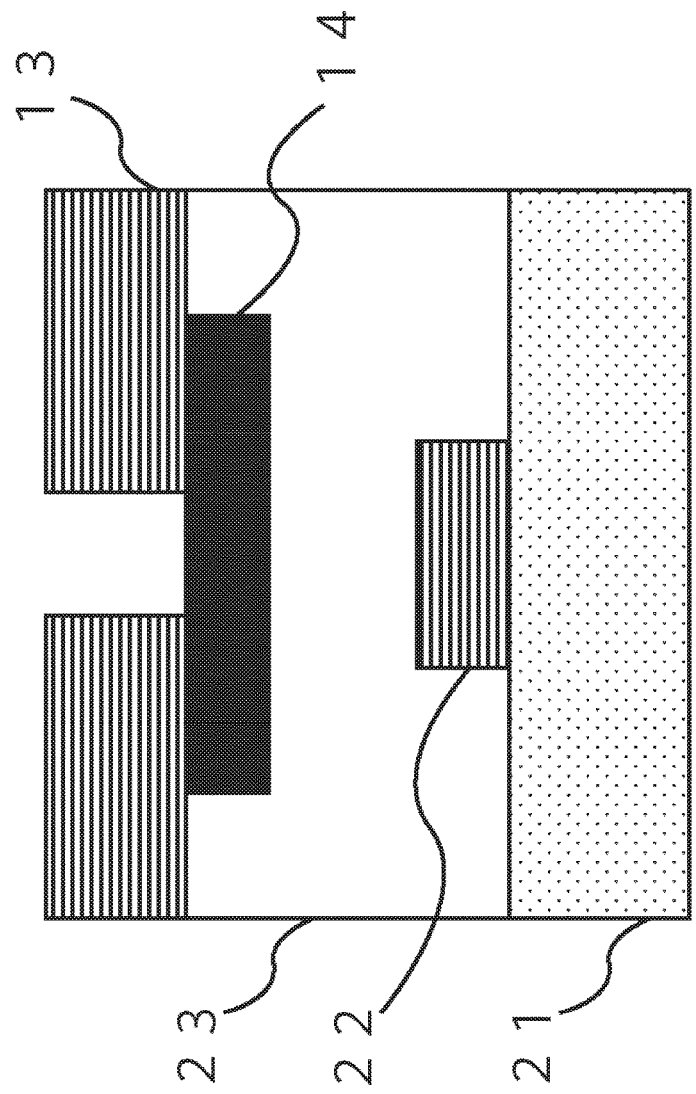

METHOD FOR MANUFACTURING WIRING PATTERN, METHOD FOR MANUFACTURING TRANSISTOR, AND MEMBER FOR TRANSFER

CROSS-REFERENCE TO RELATED APPLICATIONS

This application is a continuation application, under 35 U.S.C. § 111(a), of International Application No. PCT/JP2016/067870, filed Jun. 16, 2016, and based upon and claiming the benefit of foreign priority from Japanese Patent Application 2015-121905, filed Jun. 17, 2015, the entire contents of which are incorporated herein by reference.

TECHNICAL FIELD

The present invention relates to a method for manufacturing a wiring pattern, a method for manufacturing a transistor, and a member for transfer.

BACKGROUND ART

Oxide semiconductor films that have visible light transmissivity and electric conductivity are used as transparent electrodes of flat panel displays, thin film solar cells, and the like. Further, in order to obtain an oxide semiconductor film with wiring applied, methods are known where a layer containing a metal to serve as a wiring is formed on a substrate, a resist layer is overlaid on the metal layer, and a wiring pattern is formed by a photoresist method.

As another example, Patent Literature 1 discloses a technique related to a manufacturing method for manufacturing a thin film transistor: "a method for manufacturing a thin film transistor, which includes: a conductive layer pair forming step of forming a pair of conductive layers on a convex of a transfer mold, with the convex formed in accordance with the arrangement pattern of the thin film transistor; a semiconductor film forming step of forming, in a vacuum, a semiconductor film on the transfer mold with the conductive layers formed; a gate insulating film forming step of continuously forming, in a vacuum, a gate insulating film on the transfer mold with the semiconductor film formed; and a transfer step of transferring the gate insulating film and the semiconductor film and the conductive layers onto a wiring formed in advance on a substrate by a printing method."

CITATION LIST

Patent Literature

Patent Literature 1: Japanese Patent No. 5445590

SUMMARY OF INVENTION

Technical Problem

However, in accordance with the conventional manufacturing method, an irregular mold has to be manufactured every time the structure is changed, the scalability of the device design is thus restricted.

An object of the present embodiment is to provide a novel method in place of the conventional technology, as a technique for obtaining a thin film with a wiring pattern applied.

Solution to Problem

An aspect of the present invention has been provided to achieve the above object, and a method for manufacturing a wiring pattern according to the present invention is characterized in that the method includes: a laminate forming step of forming a laminate by bringing a first member that has a resist layer and a metal layer formed on the resist layer into contact with a second member that includes a substrate; a resist layer patterning step of subjecting the resist layer to patterning; and an etching step of selectively removing the metal layer.

In addition, the laminate forming step according to an aspect of the present invention may be characterized in that the first member and the second member are brought into contact with each other, with a resin layer interposed therebetween.

In addition, the resin layer according to the aspect of the present invention may be characterized in that the resin layer is provided on the second member.

In addition, the resin layer according to the aspect of the present invention may be characterized in that the resin layer is a photo-curable resin.

In addition, the method for manufacturing a wiring pattern according to the aspect of the present invention may be characterized in that the method includes a resin layer curing step of curing the resin layer after the laminate forming step.

Further, the laminate forming step according to the aspect of the present invention may be characterized in that the laminate is obtained by applying pressure bonding to the first member and the second member.

In addition, the first member according to the aspect of the present invention may be characterized in that the first member has a semiconductor layer formed on the metal layer.

In addition, the semiconductor layer according to the aspect of the present invention may be characterized in that the semiconductor layer is formed by a sputtering method.

The resist layer patterning step according to the aspect of the present invention may be characterized in that the resist layer is selectively exposed by light irradiation, and patterning is performed by removing either the exposed part or the unexposed part.

In addition, the resist layer according to the aspect of the present invention may be characterized in that the resist layer is a dry film resist.

In addition, the metal layer according to the aspect of the present invention may be characterized in that the metal layer is formed from copper.

A method for manufacturing a transistor according to an aspect of the present invention is characterized in that the method uses the method for manufacturing a wiring pattern according to any of the foregoing.

In addition, a method for manufacturing a transistor according to an aspect of the present invention is characterized in that the method includes: a laminate forming step of forming a laminate by bringing a first member including a resist layer, a metal layer formed on the resist layer, and a semiconductor layer formed on the metal layer into contact with a second member with a gate electrode and a gate insulating layer formed on a substrate; a resist layer patterning step of subjecting the resist layer to patterning; and an electrode forming step of obtaining a source electrode and a drain electrode by selectively removing the metal layer.

A member for transfer according to an aspect of the present invention is characterized in that the member includes a resist layer and a metal layer formed on the resist layer.

In addition, the member for transfer according to the aspect of the present invention may be characterized in that the member further includes a semiconductor layer selectively formed on the metal layer.

In addition, the semiconductor layer according to the aspect of the present invention may be characterized in that the semiconductor layer is formed by a sputtering method.

In addition, the resist layer according to the aspect of the present invention may be characterized in that the resist layer is a dry film resist.

BRIEF DESCRIPTION OF DRAWINGS

FIGS. 2(A) to 2(C) is a diagram illustrating an example of a step of forming a first laminate.

FIGS. 3(A) to 3(D) is a diagram illustrating an example of a step of forming a second laminate.

FIGS. 5(A) to 5(D) is a diagram illustrating examples of: a resist layer patterning step and an etching step.

DESCRIPTION OF EMBODIMENTS

An example of an embodiment of the present invention will be described below with reference to the drawings.

Figure 1:
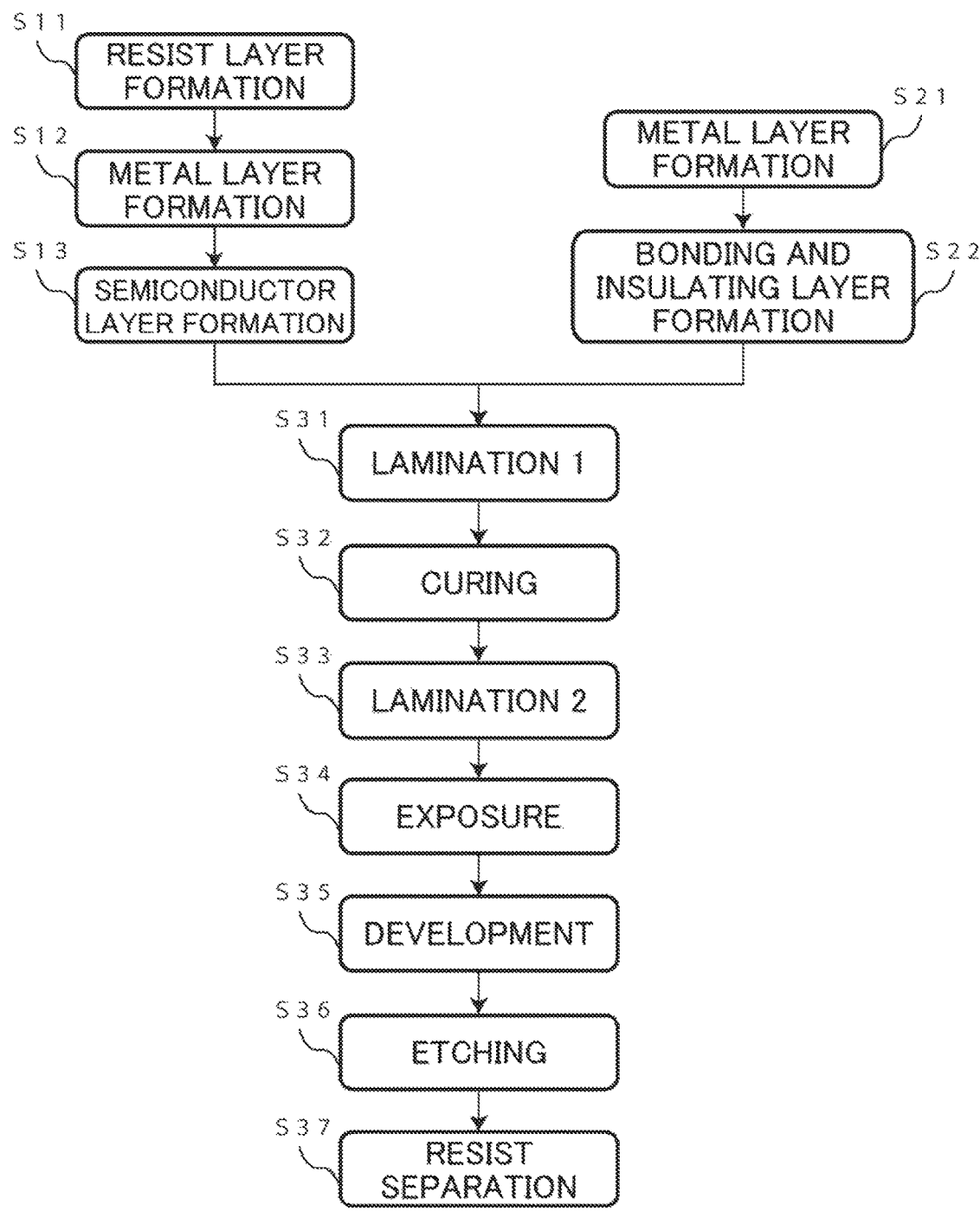
FIG. 1 is a process chart for explaining an outline example of a method for manufacturing a wiring pattern according to the present embodiment.

FIG. 1 is a process chart for explaining an outline example of a method for manufacturing a wiring pattern according to the present embodiment.

According to the present embodiment, a first laminate including a resist layer and a second laminate including a substrate are formed, and a third laminate is formed with the use of the first laminate and the second laminate. The first laminate is formed by the following steps S11 to S13, and the second laminate is formed by steps S21 to S22. The third laminate is formed by a step S31. The order of forming the first laminate and the second laminate may be any order.

First, in the step S11, the resist layer is formed. The resist layer is formed, for example, by applying a resist material on a protective sheet, but a dry film resist (hereinafter referred to as a "DFR") of a resist layer formed in advance on the protective sheet may also be used. It is to be noted that materials such as polyethylene terephthalate (PET), polyimide, and polyethylene naphthalate (PEN) can be used as the protective sheet.

Next, in the step S12, a metal layer is formed on the resist layer. Details of the laminating method will be described later.

Next, in the step S13, a semiconductor layer is formed on the metal layer. Through the foregoing steps, the first laminate is formed.

In the step S21, a metal layer is formed onto the substrate.

Next, in the step S22, a bonding and insulating layer is formed on the metal layer formed in the step S21. The bonding and insulating layer is formed from a resin that has an insulating property. Hereinafter, the bonding and insulating layer will be described as a resin layer. For the resin layer, a resin that cures in response to environmental changes is used, such as a photo-curable resin or a thermosetting resin, and curing the resin layer improves the adhesion to parts in contact with the resin layer. Through the foregoing steps, the second laminate is formed.

Next, in the step S31, the first laminate and the second laminate are stacked on one another, and subjected to a lamination treatment (pressurization treatment) with the use of a laminator. The third laminate with the first laminate and second laminate stacked is subjected to pressure bonding by performing the lamination treatment. This step aligns the first laminate and the second laminate, and improves the adhesion. It is to be noted that this step is not limited to the lamination treatment as long as the first laminate and the second laminate are stacked on one another in a predetermined lamination order, and bonded. Further, in the case of having sufficient adhesion at the joint surface between the first laminate and the second laminate, this step may be skipped. The steps from step S11 to step S31 executes a laminate forming step of forming the third laminate.

Next, in a step S32, the resin layer is cured. The environment is changed in accordance with the material used for the resin layer, and the resin layer is cured. This step executes a resin layer curing step.

Next, in a step S33, a second lamination treatment is performed. This step is a process for improving the degrees of adhesion between the respective layers, but may be skipped in the present embodiment.

Next, in a step S34, the resist layer is exposed to light. The use of, for the exposure, a photomask that shows the wiring shape causes a predetermined portion of the resist to be exposed to light.

Next, in a step S35, development is performed. The third laminate obtained in the step S34 is immersed in a developer to remove the resist layer other than the required portion. The treatments in the step S34 and the step S35 executes a resist layer patterning step.

Next, in a step S36, etching is performed. For example, the immersion of the third laminate in a predetermined solution removes the metal layer with the resist removed therefrom. Thus, the third laminate has a predetermined wiring pattern obtained. This step executes an etching step.

Next, in a step S37, the resist layer is separated. The removal of the resist layer exposes the wiring pattern formed in the step S36. Thereafter, the processing according to the present embodiment is completed.

FIGS. 2(A) to 2(B) is a diagram illustrating an example of a step of forming the first laminate. FIG. 2(A) corresponds to the step S11, FIG. 2(B) corresponds to the step S12, and FIG. 2(C) corresponds to the step S13.

First, in the resist layer forming step shown in FIG. 2(A), a resist layer 12 is formed onto a protective sheet 11. The resist layer 12 is formed by applying a photosensitive resist to the protective sheet 11. The resist material to be used is not particularly limited, for which commonly known materials can be used. It is to be noted that the resist layer 12 is formed by a commonly used coating method such as a spin coating method, a dip coating method, and a spray method. In addition, the method for forming the resist layer 12 is not limited to any coating. Further, a DFR with the protective sheet 11 and the resist layer 12 formed in advance may be used as described previously.

Next, in the metal layer forming step shown in FIG. 2(B), a metal layer 13 is formed to be stacked on the resist layer 12. For example, metals such as Cu, Al, Ti, Cr, Au, and Fe and multilayer films thereof can be used as the metal layer 13. For the formation of the metal layer 13, a film formation method is used, such as a vapor deposition method, a plating method, a printing method, lamination of Cu foil or Al foil, a sputtering method, or an ion beam sputtering method. It is to be noted that the metal layer 13 is used later as a source electrode and a drain electrode for the transistor.

Next, in the semiconductor forming step shown in FIG. 2(C), a semiconductor layer 14 is selectively formed with respect to the metal layer 13. As the semiconductor layer 14, a semiconductor material can be used, such as a-IGZO, ZnO, $Ga_2O_3$, and $In_2O_3$. The method for forming the semiconductor layer 14 is not limited, but film formation by a sputtering method can provide a low-temperature and high-performance semiconductor film. It is to be noted that while plasma is generated in the case of using a sputtering method, the generated plasma and light generated by the plasma are blocked by the metal layer 13, without reaching the resist layer 12, and the resist layer 12 can be thus prevented from being damaged due to plasma.

The patterning method for the semiconductor layer 14 is not limited, but a common lithography process with the use of a photoresist, or the like can be used, for example. The semiconductor layer 14 selectively formed with respect to the metal layer 13 can be obtained by removing an unnecessary portion of the semiconductor layer 14. Alternatively, the semiconductor layer 14 selective with respect to the metal layer 13 may be obtained through the use of ink-jet printing.

Figure 3A:
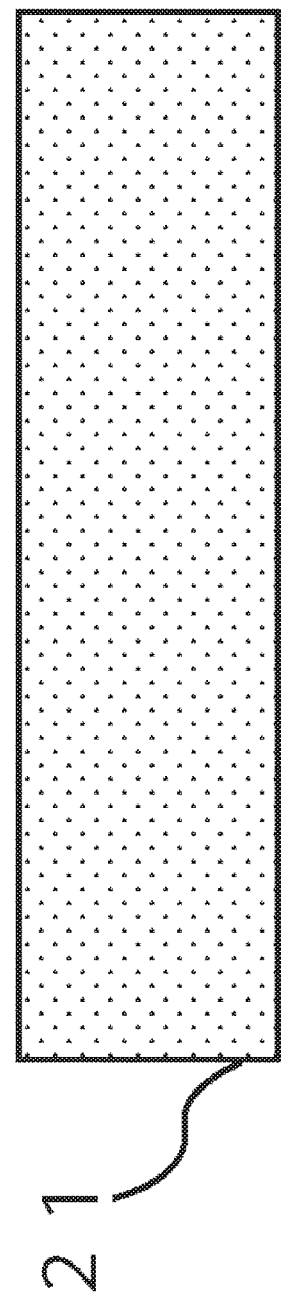

FIG. 3(A) to 3(D) is a diagram illustrating an example of a step of forming the second laminate. FIGS. 3(A), 3(B), and 3(C) correspond to the step S21 described above, and FIG. 3(D) corresponds to the step S22.

FIG. 3(A) shows a substrate 21. As the substrate 21, a resin substrate such as polyethylene terephthalate (PET), polyethylene naphthalate (PEN), and polyimide, a semiconductor substrate such as silicon (Si), gallium arsenide (GaAs), and gallium nitride (GaN), or an oxide substrate such as silicon dioxide ($SiO_2$), sapphire, and zinc oxide (ZnO) can be used.

FIG. 3(B) is a diagram illustrating a metal layer 22 formed on the substrate 21. For the metal layer 22, for example, Al, Cu, or metals such as Ti, Cr, Au, and Fe, or a multilayer films thereof can be used. The same method as that for the formation of the metal layer 13 can be used for the formation of the metal layer 22.

FIG. 3(C) is a diagram illustrating the metal layer 22 selectively removed. Since the metal layer 22 later serves as a gate electrode for the transistor, the layer is selectively removed in accordance with the design. Regarding the method for the selective removal, the unnecessary portion of the metal layer 22 may be removed by, for example, a common lithography process with the use of a photoresist, or the like. Alternatively, the selective metal layer 22 may be obtained by ink-jet printing or the like.

Next, in the bonding and insulating layer forming step shown in FIG. 3(D), a resin layer 23 is formed so as to overlap with the substrate 21 and the metal layer 22 selectively formed with respect to the substrate 21. For the resin layer 23, a photo-curable resin such as epoxy resins and acrylic resins, a thermosetting resin such as epoxy resins and acrylic resins, or a thermoplastic resin such as ethylene vinyl acetate (EVA) can be used. Besides these resins, two-component mixing type or moisture curing type resins may be used. A common film formation method is used for a method for forming the resin layer 23. It is to be noted that the resin layer 23 is used later as a gate insulating film for the transistor.

Figure 4A:
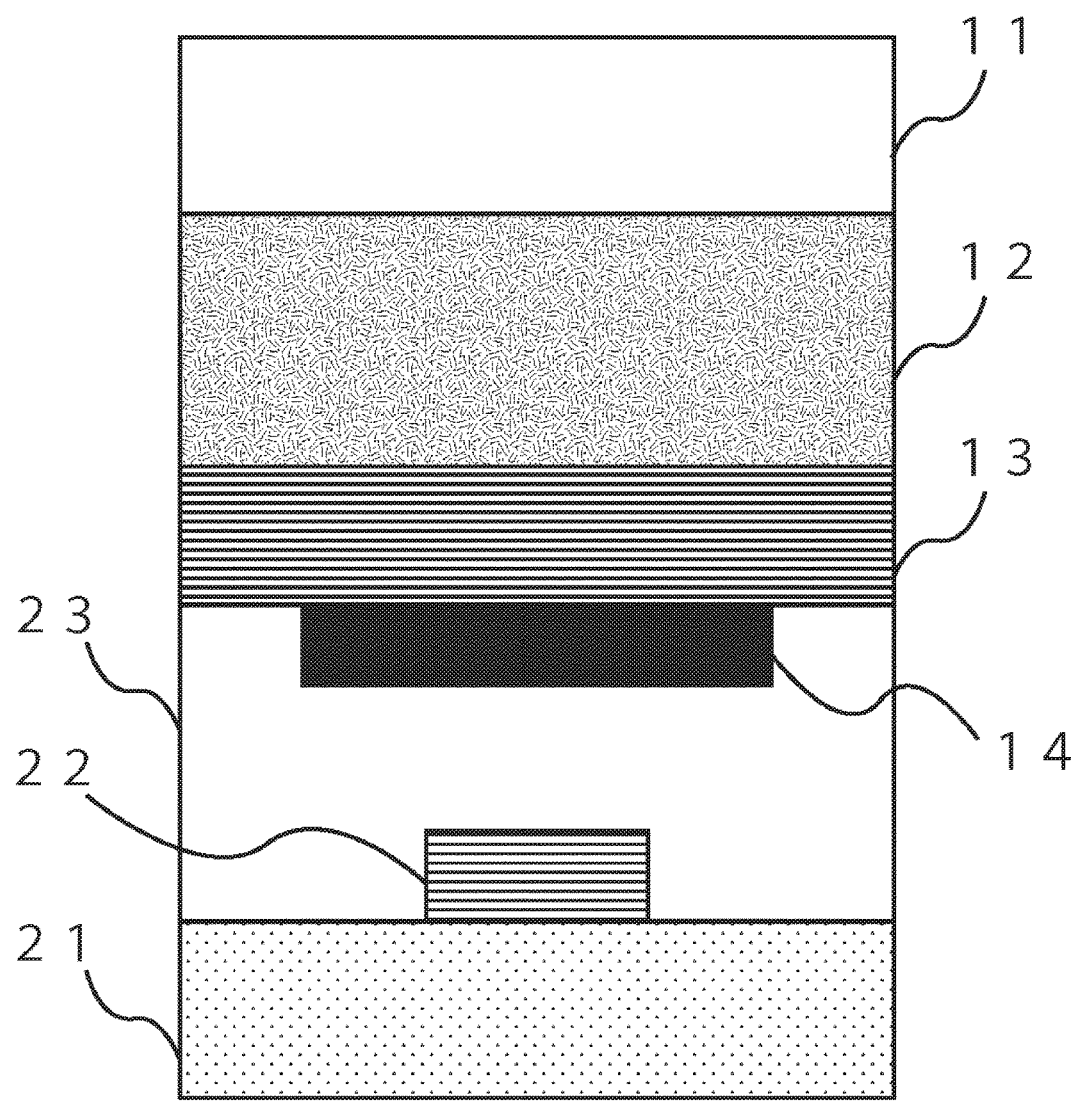
FIGS. 4(A) to 4(C) is a diagram illustrating examples of: a step of forming a third laminate; and a step of curing a resin layer.
Figure 4B:
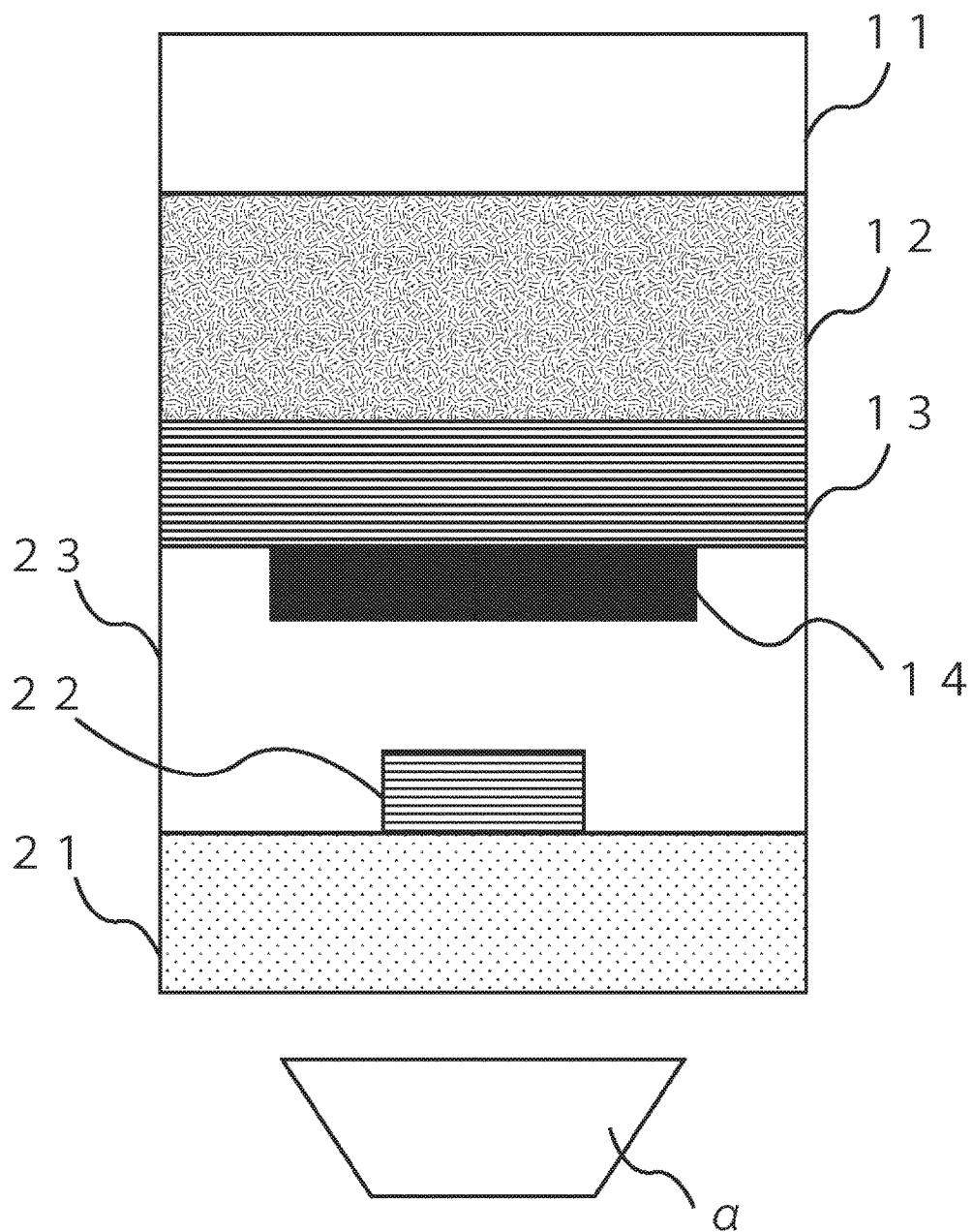
Figure 4C:
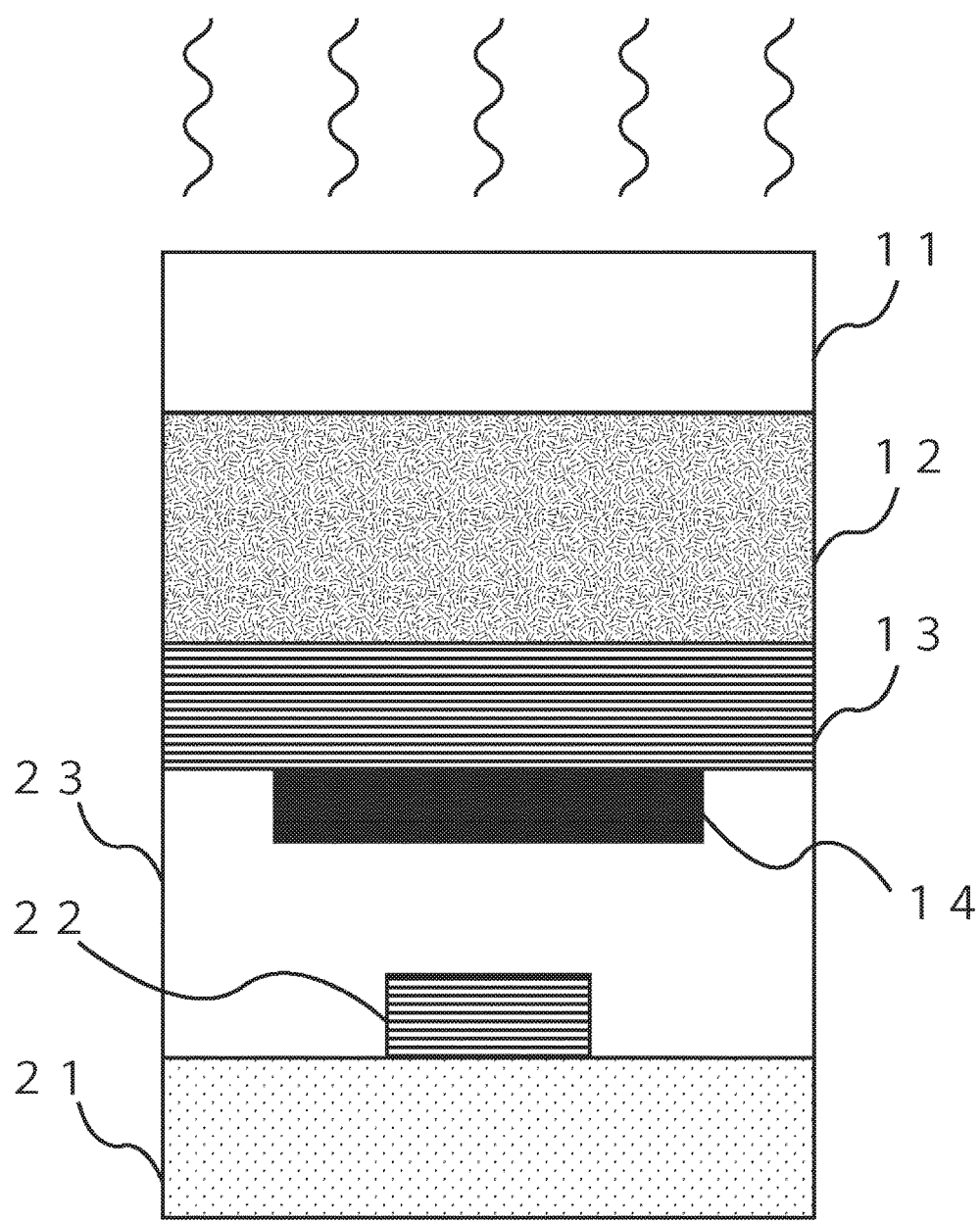

FIGS. 4(A) to 4(C) is a diagram illustrating examples of: a step of forming the third laminate; and a step of curing the resin layer. FIG. 4(A) corresponds to the step S31 described above, FIG. 4(B) corresponds to the step S32, and FIG. 4(C) corresponds to the step S33.

In the lamination 1 step shown in FIG. 4(A), the first laminate and the second laminate are stacked on one another, and subjected to pressure bonding through a laminator. In this step, the semiconductor layer 14 and the resin layer 23 are stacked on one another so as to be brought into contact with each other. This step can be performed under the condition that the resin layer 23 is not cured. This step is performed, for example, at room temperature. However, when a photo-curable resin is used for the resin layer 23, which is desirably a pre-baked material, the material may be heated during the lamination treatment. It is to be noted that the heating is desirably performed under a temperature at which the photo-curable resin undergoes no denaturation such as aggregation. For example, when SU-8 is used for the resin layer 23, it is desirable to perform the heating at a temperature of 95° C. or lower.

In addition, the resin layer 23 is cured in the resin layer curing step shown in FIG. 4(B), which is performed after this step, but the lamination 1 step and the resin layer curing step may be performed in parallel by using a thermosetting resin as the resin layer 23 and performing the heating during the lamination treatment.

Next, in the resin layer curing step shown in FIG. 4(B), the resin layer 23 is cured. When the resin layer 23 is a photo-curable resin, the resin layer 23 is cured by light irradiation from a light source α installed closer to the substrate 21. When the resin layer 23 is a thermosetting resin, the resin layer 23 is cured by heating the third laminate. This step can provide the resin layer 23 which serves as a bonding layer that improves the adhesion force of the resin layer 23 with respect to the substrate 21 and the metal layer 22 and the adhesion force of the resin layer 23 with respect to the metal layer 13 and the semiconductor layer 14.

Next, in the lamination 2 step shown in FIG. 4(C), the third laminate with the resin layer 23 cured is subjected to pressure bonding while heating. For the heating and the pressure bonding, a laminator is used. This step improves the degrees of adhesion between the respective layers. The heating is performed at a lower temperature than the softening point of the substrate 21.

Figure 5A:
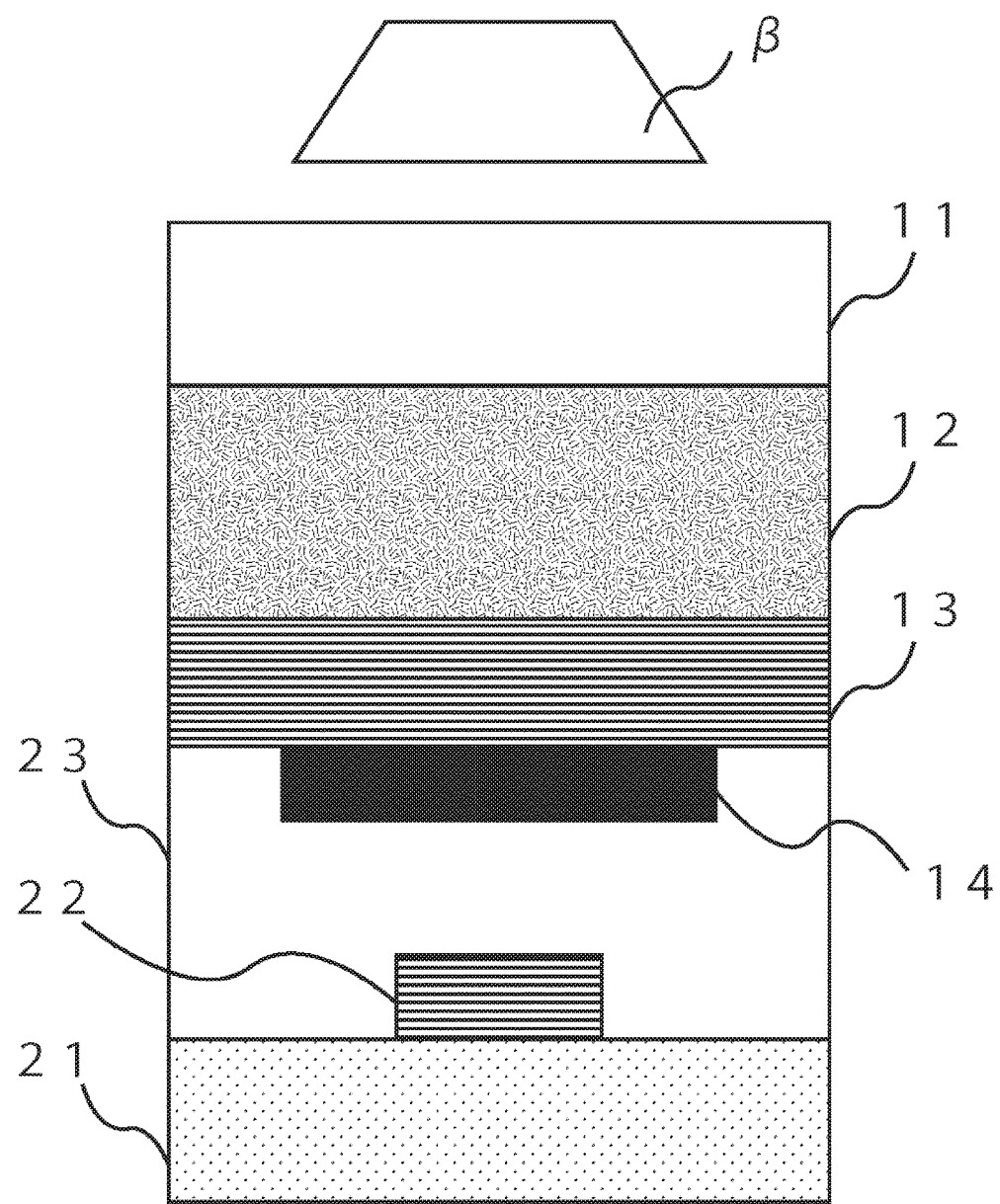

FIGS. 5(A) to 5(D) is a diagram illustrating examples of: a resist layer patterning step; and an etching step. FIG. 5(A) corresponds to the step S34 shown in FIG. 1, FIG. 5(B) corresponds to the step S35, FIG. 5(C) corresponds to the step S36, and step S5(D) corresponds to the step S37.

In the exposure step shown in FIG. 5(A), the resist layer 12 is exposed to light. In this step, the resist layer 12 is irradiated with UV light from a light source β through the use of a photomask (not shown) to selectively expose the resist layer 12 to light, thereby carrying out patterning. It is to be noted that the resist layer 12 may be a negative type for leaving a part exposed to light during development, or a positive type for leaving a part exposed to no light during development.

Figure 5B:
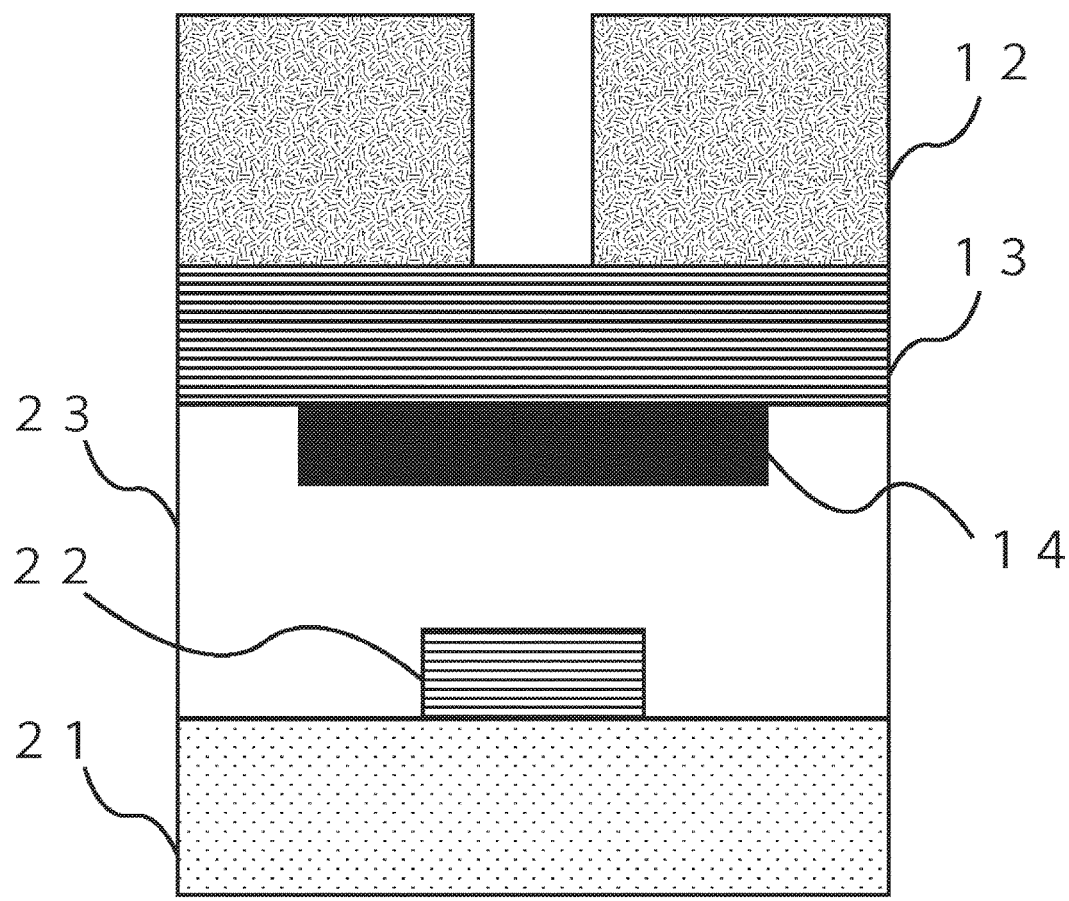

Next, in the development step shown in FIG. 5(B), the protective sheet 11 is removed, and the resist layer 12 is selectively removed. For the removal of the protective sheet 11, a method of separating the protective sheet 11 by applying a physical force thereto may be used, or a predetermined solution that dissolves the protective sheet 11 may be used. The third laminate after this step has the resist layer 12 with source electrode and drain electrode patterns, formed on the metal layer 13.

It is to be noted that the protective sheet 11 may be removed before exposing the resist layer 12 to light in the exposure step. In such a case, after removing the protective sheet 11 by the same method as described above, the resist layer 12 is selectively exposed to light. Thereafter, the development step of selectively removing the resist layer 12 is performed.

Figure 5C:
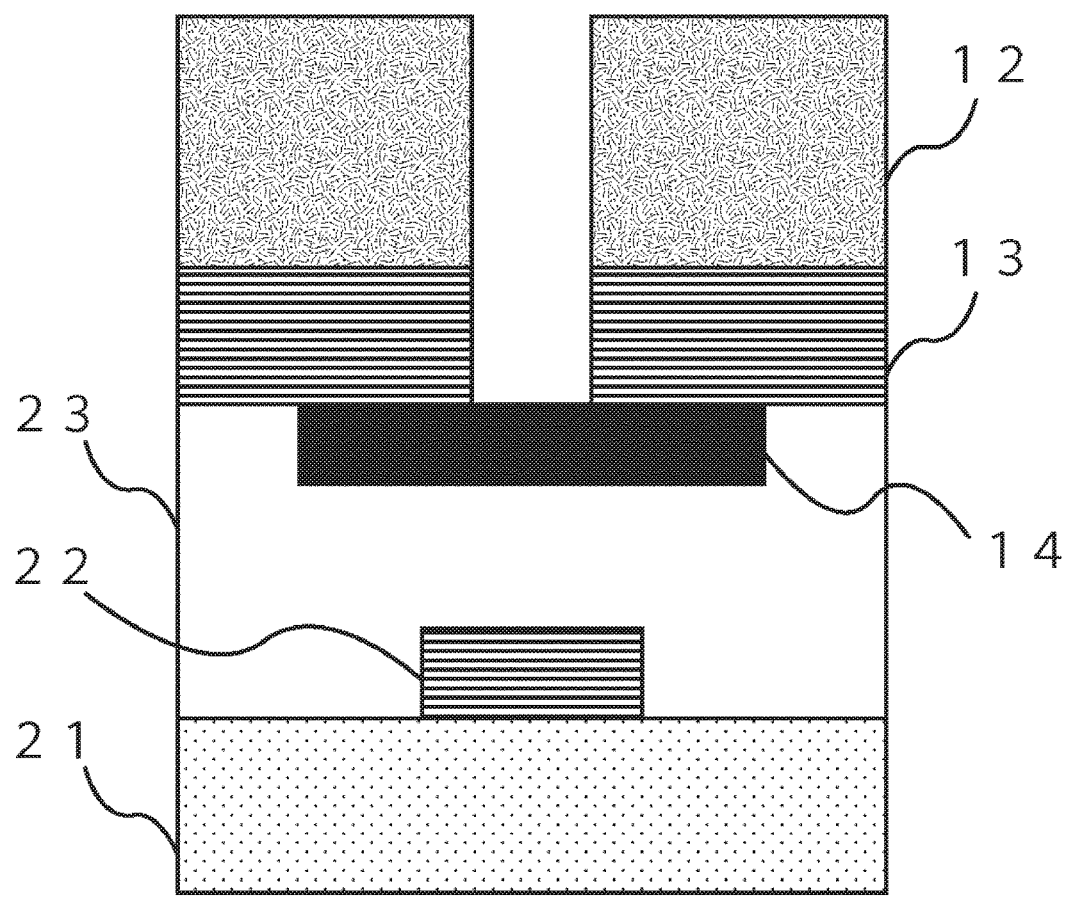

Next, in the etching step shown in FIG. 5(C), the metal layer 13 is selectively removed. The etching is performed by a common method with the use of a predetermined solution, gas or the like. This step can provide a selective metal film in accordance with the patterning shape of the resist layer 12.

Next, in the resist separation treatment shown in FIG. 5(D), the resist layer 12 is peeled off. The resist layer 12 is separated by a common method such as using a predetermined solution.

As described above, according to the present embodiment, the third laminate is formed with the use of the first laminate including the resist layer 12, the metal layer 13, and the semiconductor layer 14, and the second laminate including the substrate 21, the metal layer 22, and the resin layer 23, and the third laminate is subjected to patterning, thereby providing a desired wiring pattern.

Conventionally, a laminate is obtained by sequentially stacking constituents onto a substrate, but depending on the material of the semiconductor film, a vacuum system may be required for film formation in some cases, and when an attempt is made to carry out a step with the use of the system between other steps in order to obtain the laminate, there is a problem of complicated process control. According to the present embodiment, a thin film that has a wiring pattern applied in a more efficient manner can be obtained by separately forming the first laminate and the second laminate.

In addition, in order to obtain the oxide semiconductor film more easily, a film formation method is often used, such as a sol-gel method, an electroless deposition method, or an electrolytic deposition method. According to these film forming methods, a highly crystalline semiconductor film is obtained through the growth of a semiconductor film at high temperature by heating the laminate. However, it is difficult to obtain a highly crystalline oxide semiconductor film at a low temperature (about 100° C. to 200° C.) a resin substrate such as PET can withstand.

According to the present embodiment, the first laminate including the semiconductor layer 14 is formed separately from the second laminate including the substrate 21, and the step of forming the semiconductor layer 14 thus has no influence on the substrate 21. Therefore, the semiconductor layer 14 with better performance can be obtained without affecting the substrate 21. Therefore, according to the present embodiment, a thin film that has a wiring pattern applied can be obtained in a more efficient manner.

It is to be noted that a transistor can be obtained by using the metal layer 13 of the third laminate obtained according to the present embodiment as a source electrode and a drain electrode, the resin layer 23 thereof as a gate insulating layer, and the metal layer 22 thereof as a gate electrode.

EXAMPLE

According to this example, DFR (RD-1225 from Hitachi Chemical Co., Ltd.) is used as the protective sheet 11 and the resist layer 12 for the first laminate. In the case of the present DFR, the protective sheet 11 is coated with a photosensitive resin of 25 μm. Next, as a metal layer forming step for the first laminate, Cu particles were deposited to the DFR through the use of ion beam sputtering, thereby forming a metal layer 13 as a metal film. Thus, the metal layer 13 with high adhesion and flatness was obtained.

Next, as a semiconductor layer forming step, a-IGZO was deposited on the metal layer 13 by a sputtering method, thereby forming the semiconductor layer 14. Although there was concern about the influence of the plasma process driven by the sputtering method on the DFR, the metal film assumed the role of a light-shielding film, thus resulting in exposure of the DFR to light at a negligible level. Thus, the semiconductor layer 14 with a high mobility at low temperature has been successfully obtained.

On the other hand, in forming the second laminate, the substrate 21 of PET was prepared. As a metal layer forming step in the case of the second laminate, Cu was deposited on the substrate 21 through the use of a vapor deposition method. Thereafter, the metal layer 22 was subjected to patterning with the use of a photoresist, and etched to obtain the metal layer 22 including a wiring structure for a gate electrode.

Next, as a bonding and insulating layer forming step, a solution was prepared in which 20 wt % SU-8 (SU-8 3005 from Nippon Kayaku Co., Ltd.) was dissolved in cyclohexanone. This SU-8 is an epoxy-based negative-type photosensitive resin which is cured by i-ray. This was deposited on the substrate 21 with the metal layer 22 formed thereon by spin coating at 1000 rpm, and dried at 90° C. for 10 minutes.

Next, as a lamination 1 step, the first laminate and the second laminate were stacked so that the semiconductor layer 14 and the resin layer 23 make contact with each other, thereby forming a third laminate, and subjected to laminating without heating through the use of a laminator (LPD 3224 from Fujipura).

Next, as a curing step, the third laminate was irradiated with i-ray under an irradiation condition of 200 mJ/cm$^2$ to expose the SU-8 for use in the resin layer 23 to light. It is to be noted that the i-ray irradiation was performed from the side with the substrate 21, so as to prevent the metal layer 13 from interfering with the exposure of the resin layer 23 to light.

Next, as a lamination 2 step, the third laminate was inserted into the same laminator as described above, and subjected to pressure bonding while heating at 120° C. Next, with the use of an oven, the third laminate subjected to the pressure bonding was heated under the condition of 105° C. for 1 hour.

Next, as an exposure step, a mask with source electrode and drain electrode shapes was prepared, the mask was placed on the protective sheet 11, and the third semiconductor was irradiated with i ray from the side with the protective sheet 11.

Next, as a development step, the protective sheet 11 was separated off. Next, the third laminate was immersed in a sodium carbonate aqueous solution of 1 wt % sodium carbonate dissolved in water, thereby dissolving an unexposed part of the resist layer 12.

Next, as an etching step, an acetic acid, a hydrogen peroxide solution, and water were prepared, and the metal layer 13 was etched with the use of an etching solution of acetic acid:hydrogen peroxide solution:water mixed in proportions of 1:1:20. In accordance with this step, the Cu constituting the metal layer 13 was subjected to patterning into the structures of a source electrode and a drain electrode.

Next, as a resist separation step, the photosensitive resist layer 12 was separated off. For the separation, a sodium hydroxide solution of 1 wt % sodium hydroxide dissolved in water was used.

Figure 6:
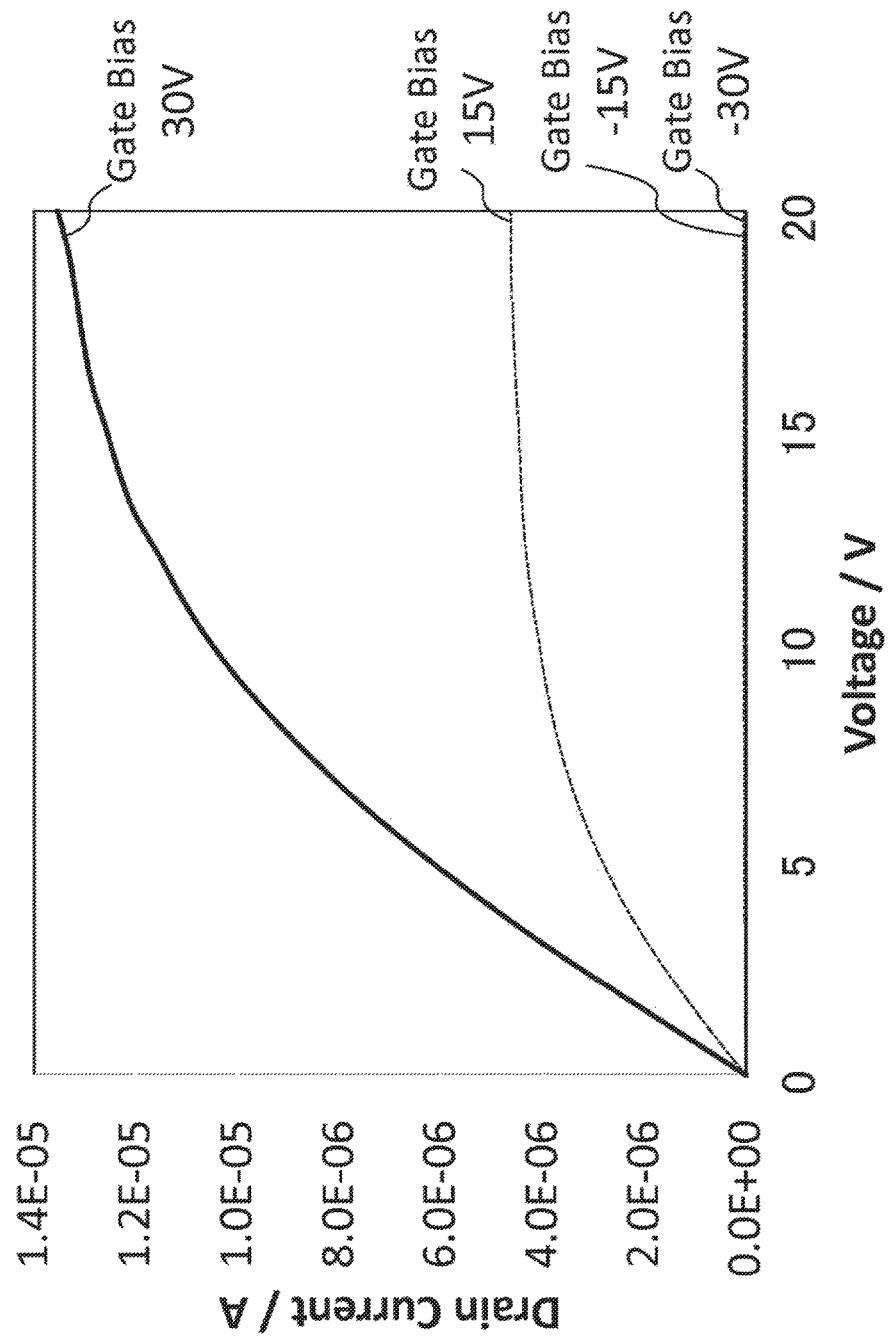
FIG. 6 is a diagram showing semiconductor characteristics of a third laminate obtained according to an example.

FIG. 6 is a diagram showing semiconductor characteristics of the third laminate obtained according to the example. As shown in this figure, it has been determined that the third laminate provides semiconductor characteristics (characteristics where a drain current flows depending on the bias voltage of the gate).

Comparative Example 1

In the metal layer forming step for the second laminate, PET was used for the substrate 21, and Cu was used for the metal layer 22 to form the metal layer 22. Thereafter, in the bonding and insulating layer forming step, instead of the resin, an aluminum oxide thin film of 200 nm was prepared as an insulator for use in the resin layer 23, and stacked on the metal layer 22, thereby forming the second laminate. Thereafter, the semiconductor layer 14 of the first laminate and the aluminum oxide thin film were brought into contact with each other, thereby forming the third laminate, but the lamination 1 step and curing step described above were nor performed, because the aluminum oxide is an inorganic material.

Thereafter, as the lamination 2 step, the third laminate was heated to 120° C. as the limit temperature of the PET. Subsequently, when the exposure step, the development step, the etching step, and the resist separation step were performed, the semiconductor layer 14 and the aluminum oxide thin film were separated off without being attached closely.

Comparative Example 2

As in Example 1, DFR was used as the protective sheet 11 and the resist layer 12. Next, as a metal layer forming step for a first laminate, the metal layer 13 of Cu was formed onto the DFR with the use of a sputtering method. In that regard, sputtering was performed at a sufficient distance between Cu as a target and the DFR so that the resist layer 12 is not affected by damage by plasma.

Next, as in Example 1, the semiconductor layer forming step was performed, thereby forming the first laminate. In addition, a second laminate was formed in the same manner as in Example 1, a third laminate was formed in the same manner as in Example 1 with the use of the first laminate and the second laminate, and the lamination 1 step, the curing step, the lamination 2 step, and the exposure step were performed.

Next, in the development step, in the same manner as in Example 1, the protective sheet 11 was separated off, and the third laminate was immersed in the sodium carbonate aqueous solution, but the resist layer 12 was not dissolved, thereby failing to achieve patterning. The plasma produced by the sputtering method is believed to have exposed the resist layer 12 to light, thereby curing the resist layer 12. From the present comparative example, it has been found that the use of the method by which the resist layer 12 is exposed to light is not suitable for forming the metal layer 13.

REFERENCE SIGNS LIST 11 protective sheet
12 resist layer
13 metal layer
14 semiconductor layer
21 substrate
22 metal layer
23 resin layer

The invention claimed is:

1. A method for manufacturing a wiring pattern, the method comprising:
   a laminate forming operation of forming a laminate by bringing a first member comprising a protective sheet, a photoresist layer formed on the protective sheet, and a metal layer formed on the photoresist layer into contact with a second member comprising a substrate;
   a photoresist layer patterning operation of subjecting the photoresist layer to patterning; and
   an etching operation of selectively removing the metal layer by using the patterned photoresist layer as a mask.

2. The method for manufacturing a wiring pattern according to claim 1, wherein in the laminate forming operation, the first member and the second member are brought into contact with each other, with a resin layer interposed therebetween.

3. The method for manufacturing a wiring pattern according to claim 2, wherein the second member is provided with the resin layer.

4. The method for manufacturing a wiring pattern according to claim 2, wherein the resin layer is a photo-curable resin.

5. The method of manufacturing a wiring pattern according to claim 2, the method further comprising a resin layer curing operation of curing the resin layer after the laminate forming operation.

6. The method for manufacturing a wiring pattern according to claim 1, wherein in the laminate forming operation, the laminate is obtained by subjecting the first member and the second member to pressure bonding.

7. The method for manufacturing a wiring pattern according to claim 1, wherein the first member comprises a semiconductor layer formed on the metal layer.

8. The manufacturing method of a wiring pattern according to claim 7, wherein the semiconductor layer is formed by a sputtering method.

9. The method for manufacturing a wiring pattern according to claim 1, wherein in the photoresist layer patterning operation, the photoresist layer is selectively exposed by light irradiation, and patterning is performed by removing either the exposed part or the unexposed part.

10. The method for manufacturing a wiring pattern according to claim 1, wherein the photoresist layer is a dry film resist.

11. The method for manufacturing a wiring pattern according to claim 1, wherein the metal layer is formed from copper.

12. A method for manufacturing a transistor, the method using the method for manufacturing a wiring pattern according to claim 1.

13. A method for manufacturing a transistor, the method comprising:
   a laminate forming operation of forming a laminate by bringing a first member comprising a resist layer, a metal layer formed on the resist layer, and a semiconductor layer formed on the metal layer into contact with a second member with a gate electrode and a gate insulating layer formed on a substrate;
   a resist layer patterning operation of subjecting the resist layer to patterning; and an electrode forming operation of obtaining a source electrode and a drain electrode by selectively removing the metal layer.

* * * * *